United States Patent [19]

Barringer et al.

[11] 4,250,536
[45] Feb. 10, 1981

[54] INTERCONNECTION ARRANGEMENT FOR CIRCUIT BOARDS

[75] Inventors: Jerry M. Barringer, Forest; Raymond W. Harris, Evington, both of Va.

[73] Assignee: General Electric Company, Lynchburg, Va.

[21] Appl. No.: 973,358

[22] Filed: Dec. 26, 1978

[51] Int. Cl.³ .............................................. H05K 1/14
[52] U.S. Cl. ................................... 361/413; 339/17 M; 339/176 MP
[58] Field of Search ................ 361/409, 406, 412–414; 339/17 M, 17 N, 17 LM, 176 MP

[56] References Cited

U.S. PATENT DOCUMENTS

| 3,270,251 | 8/1966 | Evans | 339/17 LM |
| 3,599,046 | 8/1971 | Spreitzer | 361/412 |
| 3,806,767 | 4/1974 | Lehrfell | 361/412 |
| 3,858,961 | 1/1975 | Goodman | 361/413 |
| 3,895,266 | 7/1975 | Geiger | 361/413 |

Primary Examiner—Gerald P. Tolin

Attorney, Agent, or Firm—James J. Williams

[57] ABSTRACT

An arrangement for interconnecting a pair of hybrid integrated circuit boards mounted by means of pins in an upstanding position on a horizontally extending base circuit board in closely spaced, substantially parallel relationship, each of the hybrid circuit boards being provided with a row of contact terminals extending along the upper edge thereof together with a secondary printed circuit board having a row of downwardly directed, spring-like contact elements mounted along each side edge, the contact elements beng spaced so as to correspond with the contact terminals on the hybrid boards and with oppositely disposed contact elements being interconnected by a conductor whereby the secondary board may be detachably mounted in a horizontally extending position across the upper edges of the hybrid boards with the contact elements in each row in circuit making engagement with the adjacent contact terminals on the underlying hybrid boards thereby interconnecting the printed circuits of the hybrid boards.

5 Claims, 4 Drawing Figures

INTERCONNECTION ARRANGEMENT FOR CIRCUIT BOARDS

BACKGROUND OF THE INVENTION

In circuits which incorporate printed circuit boards, it is a common practice to mount a plurality of such printed circuit boards on a base printed circuit board or what is referred to as a "mother board" with the circuit boards extending vertically upward in closely spaced relationship from such a base board. One such arrangement is shown in U.S. Pat. No. 3,227,926. With such an arrangement, relatively complex circuitry can be compactly assembled utilizing a minimum of space, a highly desirable objective in present day circuit board design. Generally, such circuit boards are provided with a plurality of pins aong one edge which are inserted within suitably provided apertures in the base circuit board with the circuit boards being thereby maintained in the vertically extending position. In a typical arrangement of this type, wherein the circuit boards are provided with hybrid integrated circuits, there is insufficient area on the base circuit board for accommodating all of the necessary pin outputs provided on the hybrid board which is to be positioned in the vertically extending position.

OBJECTS AND SUMMARY OF THE INVENTION

Accordingly, a primary object of this invention is to provide a new and novel arrangement for interconnecting a plurality of printed circuit boards.

Another object of this invention is to provide a new and novel interconnecting arrangement for a plurality of hybrid integrated circuit boards mounted vertically in closely spaced relationship on a mother board.

Still another object of this invention is to provide a new and novel interconnecting arrangement for vertically mounted hybrid integrated circuit boards which permits a substantial increase in the number of pin connections on each of the hybrid circuits and which permits a substantial reduction in the area of the base circuit board on which the hybrid circuit boards are mounted.

Still another object of this invention is to provide a new and novel printed circuit board for use in interconnecting a plurality of integrated circuit boards.

Still another object of this invention is to provide a new and novel printed circuit board for interconnecting hybrid integrated circuit boards vertically mounted in closely spaced relationship on a base printed circuit board which may be easily attached to and detached from a plurality of closely spaced integrated circuit boards.

The objects of the invention and other related objects are accomplished by providing a base circuit board having a plurality of apertures for accommodating connector pins provided on a pair of hybrid printed circuit boards, each having a lower edge and an upper edge with the pins extending along the lower edge of each of the hybrid printed circuit boards. The hybrid printed circuit boards are mounted on the base circuit board in an upstanding adjacent relationship by insertion of the pins onto the base circuit board apertures and the upper edge of each of the hybrid circuit boards are provided with a plurality of contact terminals arranged in spaced-apart relationship. A secondary circuit board having a pair of side edges and a plurality of contact elements on the underside adjacent each of the side edges is mounted on the upper edges of the two adjacent hybrid boards with the contact elements releasably engagable with a respective one of the contact terminals on each adjacent upper edge of the hybrid circuit boards thereby interconnecting the printed circuits on each of the hybrid boards.

The invention will be better understood as well as other objects, and advantages thereof will become more apparent from the following detailed description of the invention taken in conjunction with the drawings.

DESCRIPTION OF THE PREFERRED EMBODIMENT

Figure 1:
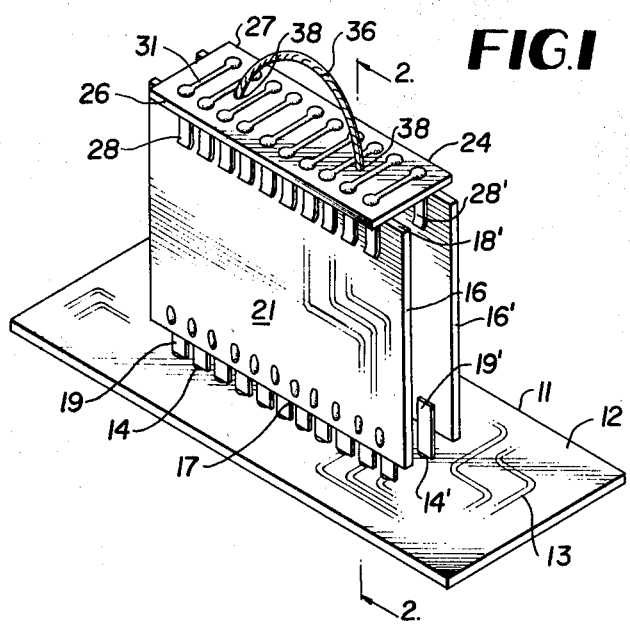
FIG. 1 is a perspective view of the interconnection arrangement for circuit boards in accordance with the invention.

Referring now to FIG. 1, there is shown the interconnection arrangement of the invention for circuit boards which includes a base printed circuit board 11 which may be mounted on a suitable support in a horizontally extending position. The base printed circuit board 11 is of the conventional type having an upper surface 12 provided with a conductive circuit path or printed circuit 13 and a plurality of apertures or sockets 14 of the type for accommodating pins forming an edge connector for a printed circuit board. In the illustrated embodiment, two rows of such apertures 14, 14' are provided in the base printed circuit board 11 as will be explained hereinafter.

The base printed circuit board 11 is arranged to support a plurality of integrated circuit boards in an upstanding position perpendicular to the base circuit board 11 in closely spaced relationship as shown and, in the illustrated embodiment, the base circuit board 11 is arranged to support two of such integrated circuit boards 16, 16' which are of substantially identical configuration. The circuit boards 16, 16' are preferably of the type referred to as "hybrid integrated circuit boards".

Each of the hybrid circuit boards 16, 16' are provided with a lower edge 17 and an upper edge 18, the lower edge being provided with a plurality of pins 19, 19' arranged in linear fashion at predetermined intervals. Thus, pins 19 on hybrid circuit board 16 are arranged to be accommodated within the apertures 14 on the base board 11 and pins 19' are arranged to be accommodated in apertures 14' so as to support the hybrid boards 16, 16' in the closely spaced vertically extending position shown in FIG. 1. As is well known, each of the hybrid boards 16, 16' is provided with a conductive circuit path or printed circuit 21, 21' on the surface thereof.

Figure 3:
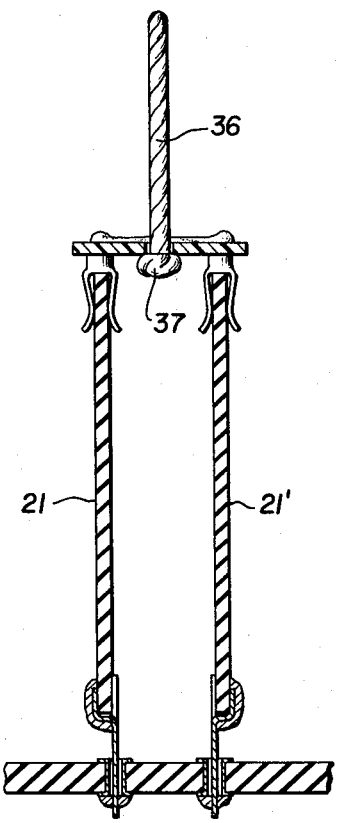
FIG. 3 is a fragmentary elevation view of the upper portion of one of the hybrid printed circuit boards incorporated in the arrangement of FIG. 1.

As shown best in FIG. 3, wherein the upper portion of board 16 is shown, there are provided a plurality of contact terminals 23, each of which extend through the thickness of the board 16 and form terminal connectors for the printed circuit 21 by means of which the printed circuit 21 is connected to the circuitry 13 provided on the base circuit board 11. Similarly, board 16' is provided with a plurality of contact terminals 23'.

In order to interconnect the contact terminals 23, 23' and therefore the printed circuits 21, 21' on the boards 16, 16' respectively, interconnecting means are provided which are positioned in a substantially horizontally extending position along the upper edges 18, 18' of the boards 16, 16' respectively. More specifically, the interconnecting means includes a secondary connecting board 24 having longitudinally extending side edges 26, 26' which is arranged to be positioned on the upper edges 18, 18' of the boards 16, 16' respectively with the underside of the secondary board 24 adjacent.

Each of the side edges 26, 26' of board 24 is provided with a plurality of downwardly depending contact elements or spring fingers 28, 28' which are arranged in linear fashion at predetermined intervals corresponding to the spacing of the contact terminals 23, 23' on boards 16, 16' respectively. Each pair of corresponding spring fingers 28, 28' is electrically interconnected by a conductor 30, preferably covered with a metallic material such as solder which may be in the form of a printed circuit so that that portion of the printed circuit 21 on board 16 connected to each terminal 28 is bridged or electrically connected to the corresponding terminal 28' connected to a connection point on the printed circuit 21' on board 16'.

Figure 2:
FIG. 2 is an enlarged sectional view taken substantially along line 2—2 of FIG. 1 in the direction of the arrow.
Figure 4:
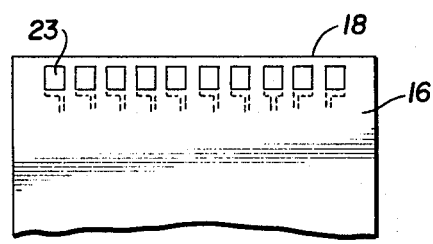
FIG. 4 is an end view partially in section of the secondary connecting board incorporated in the arrangement of FIG. 1.
Figure 4:
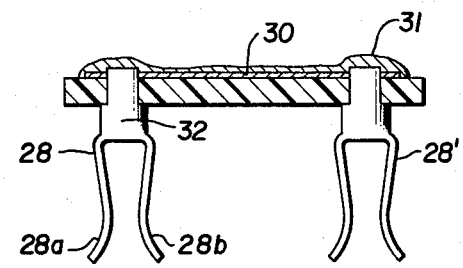

Referring to FIGS. 2 and 4, it can be seen that these contact fingers 28, include a base 32 by means of which the contact element or finger 28 is connected to the board 24 and a pair of spring members 28a, 28b which are resiliently urged apart upon insertion of the upper edges 18, 18' and contact terminals 23, 23' on the board 16, 16' respectively therebetween.

To assemble the interconnection arrangement in the form shown in FIG. 1, the two hybrid boards 16, 16' are mounted vertically in closely spaced relationship on the base circuit board 11 by insertion of the pins 19, 19' of each board within the appropriate sockets or apertures 14, 14' on the base circuit board 11. The secondary connecting board 24 is then mounted as shown in FIG. 1 by pressing down the board 24 onto the upper edges 18, 18' of the boards 16, 16' in a manner such that the upper edges 18, 18' of the boards are accommodated within the contact elements or spring members 28a, 28b as shown best in FIG. 2. Thus, the connecting board 24 is releasably positioned on the boards 16, 16' and a connection is made between the contact terminals 23, 23' and therefore between the integrated circuits 21, 21' on the boards 16, 16'.

Preferably, means are provided for removing the board 24 from the mounted position of FIG. 2 which in the illustrated embodiment preferably comprise a string loop 36, or the like, having knotted ends 37 and extending through apertures 38 in the board 24. Thus, by manually gripping the string loop 36 and pulling upwardly, the board 24 may be easily removed from the spring engagement with the upper edges 18, 18' of the boards 16, 16'.

What is claimed and desired to be secured by letters patent of the United States is:

1. A circuit board mounting arrangement comprising, in combination: a base integrated circuit board having a printed circuit and a plurality of apertures for accommodating connector pins; a pair of hybrid integrated circuit boards each having a lower edge and an upper edge and a printed circuit thereon; a plurality of connector pins arranged at predetermined intervals on the lower edge of each of said pair of hybrid circuit boards, inserted into said base circuit board apertures, and mounting said pair of hybrid circuit boards in adjacent relationship on said base circuit board in an upstanding position on said base circuit board; contact means positioned on the upper edge of each of said hybrid circuit boards and connected to the printed circuit on the respective hybrid circuit board, said contact means on said hybrid circuit boards comprising a plurality of contact terminals arranged in spaced relation on the upper edge of each of said pair of hybrid circuit boards; a secondary integrated circuit board having a printed circuit and pair of side edges; and contact means on said secondary circuit board adjacent each of said side edges in releasable engagement with said contact means on the upper edges of said hybrid circuit boards, said contact means on said secondary circuit board comprising a plurality of downwardly extending pairs of spring fingers for releasably accommodating one of said contact terminals on an associated hybrid circuit board, whereby said secondary circuit board and said hybrid circuit boards are held together in an operative position to interconnect the printed circuits on each of said pair of hybrid circuit boards.

2. A circuit board mounting arrangement in accordance with claim 1 including gripping means on said secondary circuit board for manually releasing said secondary circuit board from said operative position on said hybrid circuit boards.

3. A circuit board mounting arrangement in accordance with claim 2 wherein said gripping means comprises a string loop.

4. An interconnected circuit board arrangement comprising, in combination: a pair of integrated circuit boards each having a printed circuit thereon and arranged in spaced-apart, parallel relationship; a substantially planar printed circuit board having a pair of side edges; contact means on said planar printed circuit board adjacent each of said side edges releasably engaging the upper edges of said pair of integrated circuit boards, said contact means comprising downwardly extending pairs of spring fingers arranged at predetermined intervals on each of said planar printed circuit board side edges for releasably engaging with printed circuits on an associated one of said pair of integrated circuit boards; and said planar printed circuit board having a printed circuit thereon connected to said contact means for interconnecting the printed circuits on said pair of integrated circuit boards.

5. The circuit board arrangement of claim 4 wherein said planar circuit board includes gripping means for manually releasing said planar circuit board from engagement with said associated pair of integrated circuit boards.

* * * * *